United States Patent
Tanaka et al.

(10) Patent No.: US 6,871,168 B1
(45) Date of Patent: Mar. 22, 2005

(54) FAILURE ANALYSIS SYSTEM OF SEMICONDUCTOR MEMORY DEVICE

(75) Inventors: Mikio Tanaka, Tokyo (JP); Masaaki Sugimoto, Tokyo (JP); Takehiko Hamada, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/570,863

(22) Filed: May 12, 2000

(30) Foreign Application Priority Data

May 12, 1999 (JP) .......................................... 11/130709

(51) Int. Cl.⁷ .............................................. G06F 17/50
(52) U.S. Cl. ................................ 703/2; 716/4; 702/185
(58) Field of Search .......................... 703/2; 716/4, 19; 702/185

(56) References Cited

U.S. PATENT DOCUMENTS

| | | | | |
|---|---|---|---|---|
| 5,777,901 A | * | 7/1998 | Berezin et al. | 716/19 |
| 6,374,199 B1 | * | 4/2002 | Sugimoto | 703/2 |
| 6,442,733 B1 | * | 8/2002 | Fujiwara et al. | 716/4 |
| 6,493,654 B1 | * | 12/2002 | Sugimoto | 702/185 |

FOREIGN PATENT DOCUMENTS

| | | |
|---|---|---|
| JP | 6-187800 | 7/1994 |
| JP | 7-72206 | 3/1995 |
| JP | 7-85697 | 3/1995 |
| JP | 8-124977 | 5/1996 |
| JP | 2629523 | 4/1997 |
| JP | 10-222998 | 8/1998 |
| JP | 11-001680 | 1/1999 |
| JP | 11-186354 | 7/1999 |

* cited by examiner

*Primary Examiner*—Thai Phan
(74) *Attorney, Agent, or Firm*—Young & Thompson

(57) ABSTRACT

In failure analysis method of a semiconductor memory device, an absolute value of a position difference between two fail bits of a two-dimensional bit map is calculated while a histogram corresponding to the absolute value of the position difference is updated. The bit map indicates a map of fail bits and each fail bit corresponds to a fail memory cell. The above calculation is repeated to all combinations of two of the fail bits in the bit map. Then, an expectation function value is calculated for each of values from the histograms and the number of the fail bits. Finally, whether the fail bits has regularity or irregularity for each value is determined based on the calculated expectation function value for the value.

66 Claims, 8 Drawing Sheets

FAILURE ANALYSIS SYSTEM OF SEMICONDUCTOR MEMORY DEVICE

BACKGROUND OF THE INVENTION

1. Field of the Invention

The present invention relates to a failure analysis system of a semiconductor memory device.

2. Description of the Related Art

LSI failure analysis apparatuses commercially available from KLA-Tencor and Inspex in United States are conventionally known. These apparatuses are possible to analyze failure in case that about tens of thousands of fails exist on a wafer for semiconductor memory devices.

A memory LSI failure analysis apparatus is disclosed in Japanese Laid Open Patent Application (JP-A-Heisei 07-072206) corresponding to Japanese Patent No. 2629523. In this reference, a test result is sent from a memory tester to a personal computer. The know-how of the lay-out technical experts, process technical experts and circuit technical experts is implemented into the personal computer. The personal computer refers to the know-how of the experts to instruct the memory tester to carry out a next test. Thus, a fail cause of the LSI can be automatically found as is the test is carried out while the design technical expert carries on conversation with the memory tester. For this purpose, a bit map data from the tester is first classified by a main expert. Then, a sub-expert is started in accordance with the classifying result to automatically find the fail cause at short time. these results are statistically processed, and the factor determining a yield is analyzed. Thus, the yield can be improved.

Moreover, LSI failure analysis apparatuses are disclosed in U.S. patent application Ser. No. 09/219,349 by Sugimoto claiming the priority based on Japanese Patent Application (Tokuganhei 9-355926), and U.S. Pat application Ser. No. 09/475067 by Sugimoto, entitled "FAULT DISTRIBUTION ANALYZING SYSTEM" and claiming the priority based on Japanese Patent application (Tokuganhei 11-001680). In theses LSI failure analysis apparatuses, the intervals, kinds and frequencies of fail bits are analyzed and it is determined whether the fail bits are caused from the design of layout, circuit or circuit. The disclosures of these US Patent Applications are incorporated herein by reference.

In the above-mentioned conventional failure analysis apparatuses, an upper limit of analyzable fail bits in number is low. The capacity of a dynamic random access memory (hereinafter, to be referred to as a DRAM) which is assumed in the failure analysis apparatuses commercially available from KLA-Tencor and Inspex is 16 megabits or 64 megabits. Also, the number of chips in the DRAM is about a few hundreds on a single wafer having the diameter of 200 mm. Even if a fail bit density is supposed to be 10 ppm, that is, it is supposed that ten fail bits exist in a million bits, the number of fail bits exceeds 100,000 for every wafer. The capacity of a semiconductor memory device is further increased in future to achieve a high density. It is necessary to analyze fail bits of a DRAM having the capacity equal to or more than 256 megabits from now. In this case, the number of fail bits to be analyzed would be exponentially increased. For example, if the capacity is increased to 4 times and the number of chips is increased to 2.5 times by use of a large diameter wafer, the number of fail bits will be increased to 10 times. Therefore, in the conventional apparatuses, necessary and sufficient analysis can not be carried out. Using the conventional failure analysis apparatus, the number of analyzable wafers is decreased to $\frac{1}{10}$ or below so that the product yield would be decreased due to the delay of discovery of any fail cause.

Moreover, in these references, the processing to analyze the kinds and frequencies of divisors of the intervals between the fail bits is carried out the number of times equal to the number of combinations of the fail bits. Therefore, the load for the failure analysis would be increased proportionally to the square of the number of fail bits. Thus, when the number of fail bits is increased, the analysis time would be also increased. As a result, the decrease of the number of wafers to be analyzed and the degradation of the practicality can not be avoided.

In conjunction with the above description, a fail mode analysis apparatus of storage elements is disclosed in Japanese Laid Open Patent Application (JP-A-Heisei 6-187800). In the fail mode analysis apparatus of this reference, an analysis section (22) recognizes a fail bit map, which shows an operation test result of the storage elements, as a 2-dimensional image which has the same bit layout arrangement as that of the tested storage elements. The analysis section (22) analyzes a fail mode of the tested storage elements from the 2-dimensional image. A calculating section (23) calculates a sum of products of data of fail bit map in a small region and a data template for line failure which follows a fail bit arrangement. A determining section (24) determines a fail mode based on the calculation result. In this way, the fail mode of the tested storage element is analyzed based on the 2-dimensional image.

Also, a method of testing a semiconductor memory unit is disclosed in Japanese Laid Open Patent Application (JP-A-Heisei 7-85697). In this reference, a fail bit is detected in a failure analysis system. Then, a specific fail mode is aimed at, and the fail bits corresponding to the specific fail mode are extracted based on a desired criterion to carry out a failure analysis. Also, various tests are implemented to the fail bits to which the classification of the fail modes has been accomplished, to specify a fail cause. As a result, the fail bits corresponding to the specific fail mode are extracted from the fail modes to make a failure analysis object clear.

Also, a semiconductor device failure analysis system is disclosed in Japanese Laid Open Patent Application (JP-A-Heisei 8-124977). In a test data analytic system (101) of this reference, analysis is carried out based on the data obtained from a alien substance test (102) and outward appearance test (103) in a manufacturing line (111), the data obtained in a final wafer test (112) and the data from an FB analysis system (105). The FB analysis system (105) extracts a fail point and a fail causing point from a distribution of fail bits (FB) using the data obtained in the final wafer test (112) and an LSI design data (107). Then, the FB analysis system (105) refers to fail cause know-how data (108) to carry out the estimation (113) of a fail cause. An observing unit (109) observes coordinates of the fail point and the fail causing point which have been transferred from the FB analysis system (105) to specify a fail cause and a fail process. Also, an alien substance which has been detected by the observation unit (109) analyzes the component of an alien substance by an analysis apparatus (110) to specify the fail cause and the fail process.

In addition, a method of testing a memory test apparatus is disclosed in Japanese Laid Open Patent Application (JP-A-Heisei 10-222998). In this reference, the memory test apparatus (10) is composed of a failure analysis memory (5), a central processing unit (11) which carries out physical transformation and fail bit map display processing for every element, a display unit (12) which displays the position of a fail cell on a fail bit map for every element, and a storage unit (13) which stores the processing contents of the central processing unit (11). In the memory test apparatus (10), the semiconductor memory is tested and the positions of the fail cells are stored in the failure analysis memory (5). The fail bit maps are displayed from the data stored in the failure analysis memory (5) for every memory block, bit line, word line or other failure, based on a mask data which has been used in the process of a wafer process.

SUMMARY OF THE INVENTION

Therefore, an object of the present invention is to provide a semiconductor memory device failure analysis system in which the processing time of failure analysis can be reduced.

Another object of the present invention is to provide a semiconductor memory device failure analysis system in which the number of times of processing to analyze the kinds and frequencies of divisors of the intervals between fail bits can be decreased.

Still another object of the present invention is to provide a semiconductor memory device failure analysis system in which a failure analysis method can be selected based on an estimated processing time.

Yet still another object of the present invention is to provide a semiconductor memory device failure analysis system in which failure analysis is carried out based on an address of each of fail bits.

It is an object of the present invention to provide a semiconductor memory device failure analysis system which can analysis a semiconductor memory device with a large memory capacity at a short analysis time.

Another object of the present invention is to provide a method of analyzing a semiconductor memory device in any one of the above semiconductor memory device failure analysis system.

Still another object of the present invention is to provide a computer readable recording medium in which a program for the above method is recorded.

In order to achieve a first aspect of the present invention, a failure analysis method of a semiconductor memory device, is attained by (a) calculating an absolute value of a position difference between two fail bits of a two-dimensional bit map while updating a histogram corresponding to the absolute value of the position difference, the bit map indicating a map of fail bits and each fail bit corresponding to a fail memory cell; by (b) repeating the (a) calculating to all combinations of two of the fail bits in the bit map; (c) calculating an expectation function value for each of values from the histograms and the number of the fail bits; and by (d) determining whether the fail bits has regularity or irregularity for each value, based on the calculated expectation function value for the value.

Here, the (a) calculating includes calculating the absolute value of the position difference in X- or Y coordinate.

The (a) calculating includes: incrementing the histogram corresponding to the difference by "1". In this case, the (c) calculating includes: calculating the following equation for the expectation function value:

$$T(f)=2f\Sigma H(d_f)/\{n(n-1)-2H(0)\}$$

where T(f) is the expectation function value for the value f, $d_f$ is the absolute value of the position difference having the value f as a divisor. $H(d_f)$ is the histogram for the absolute value of the position difference $d_f$, H(0) is the histogram for the absolute value of the position difference of "0", and n is the number of the fail bits.

Also, the (b) repeating includes: determining whether each of the fail bits is within a specified region; and repeating the (a) calculating to all combinations of two of all the fail bits within the specified region in the bit map.

Also, the failure analysis method may further includes: specifying the specified region.

Also, the (d) determining includes: determining that the fail bits has the regularity for the value, when the expectation function value for the value is larger than "1".

In order to achieve a second aspect of the present invention, a failure analysis method of a semiconductor memory device, is attained by (a) determining whether a position of each of fail bits of a two-dimensional bit map is within a specified region while updating a first histogram for the position, the bit map indicating a map of fail bits and each fail bit corresponding to a fail memory cell; (b) calculating an absolute value of a position difference between two of the fail bits within the specified region while updating a second histogram for the absolute value of the position difference with the first histograms for the two fail bits; (c) repeating the (b) calculating to all combinations of two of the fail bits within the specified region; (d) calculating an expectation function value for each of values from the first and second histograms and the number of the fail bits within the specified region; and (e) determining whether the fail bits within the specified region has regularity or irregularity for each value, based on the calculated expectation function value for the value.

Also, the (b) calculating includes: calculating the absolute value of the position difference in X- or Y coordinate. Also, the (a) determining includes: incrementing the first histogram for the fail bit within the specified region by "1".

Also, the (b) calculating includes: incrementing the second histogram for the absolute value of the position difference by a product of the first histograms for the two fail bits within the specified region. In this case, the (d) calculating includes: calculating the following equation for the expectation function value:

$$T(f)=2f\Sigma H(d_f)/(n^2-\Sigma W^2)$$

where T(f) is the expectation function value for the value f, $d_f$ is the absolute value of the position difference having the value f as a divisor, $H(d_f)$ is the second histogram for the absolute value of the position difference $d_f$, W is each of the first histograms, and n is the number of the fail bits within the specified region.

Also, the failure analysis method may further includes: specifying the specified region.

Also, the (e) determining includes: determining that the fail bits within the specified region has the regularity for the value, when the expectation function value for the value is larger than 1.

In order to achieve a third aspect of the present invention, a failure analysis method of a semiconductor memory device, is attained by (a) determining whether a position of each of fail bits of a two-dimensional bit map is within a specified region while updating a first histogram for the position, the bit map indicating a map of fail bits, each fail bit corresponding to a fail memory cell, and the fail bit within the specified region being a regional fail bit; by (b) carrying out first calculation of an absolute value of a position difference between two regional fail bits while incrementing a second histogram for the absolute value of the position difference by a first value, repeating the first calculation to all combinations of two of the regional fail bits, and carrying second calculation of a first expectation function value for each of values from the second histograms and the number of the regional fail bits; by (c) carrying out third calculation of the absolute value of the position difference between two of the regional fail bits while incrementing a third histogram for the absolute value of the position difference by a second value which is determined based on the first histograms for the two regional fail bits, repeating the third calculation to all combinations of two of the regional fail bits, and carrying out fourth calculation of a second expectation function value for the value from the first and second histograms and the number of the regional fail bits; by (d) selectively executing one of the (b) and the (c) based on an execution time of the (b) and an execution time of the (c); and (e) determining whether the regional fail bits has regularity or irregularity for each value, based on the calculated expectation function value for the value.

Here, each of the (b) and (c) includes: carrying out the first or third calculation of the absolute value of the position difference in X- or Y coordinate.

Also, the (a) determining includes: incrementing the first histogram for the regional fail bit by "1". In this case, the (b) carrying out second calculation includes: calculating the following equation for the first expectation function value:

$$T(f)=2f\Sigma H(d_f)/\{n(n-1)-2H(0)\}$$

where T(f) is the calculated first expectation function value for the value f, $d_f$ is the absolute value of the position difference having the value f as a divisor, $H(d_f)$ is the second histogram for the absolute value of the position difference $d_f$, H(0) is the second histogram for the absolute value of the position difference of "0", and n is the number of the regional fail bits.

Alternatively, the (c) carrying out the third calculation includes: incrementing the third histogram for the absolute value of the position difference by a product of the first histograms for the two regional fail bits. In this case, the (c) carrying out the fourth calculation includes: calculating the following equation for the second expectation function value:

$$T(f)=2f\Sigma H(d_f)/(n^2-\Sigma w^2)$$

where T(f) is the second expectation function value for the value f, $d_f$ is the absolute value of the position difference having the value f as a divisor, $H(d_f)$ is the third histogram for the absolute value of the position difference $d_f$, W is each of the first histograms, and n is the number of the regional fail bits.

The failure analysis method may further includes: specifying the specified region.

Also, the (e) determining includes: determining that the fail bits within the specified region has the regularity for the value, when the calculated expectation function value for the value is larger than "1".

In order to achieve a fourth aspect of the present invention, a failure analysis apparatus of a semiconductor memory device, includes: a first processing unit which calculates an absolute value of a position difference between two fail bits of a two-dimensional bit map while updating a histogram corresponding to the absolute value of the position difference, the bit map indicating a map of fail bits and each fail bit corresponding to a fail memory cell; a second processing unit which repeatedly activates the first processing unit for all combinations of two of the fail bits in the bit map; a third processing unit which calculates an expectation function value for each of values from the histograms and the number of the fail bits; and a fourth processing unit which determines whether the fail bits has regularity or irregularity for each value, based on the calculated expectation function value for the value.

The first processing unit calculates the absolute value of the position difference in X- or Y coordinate.

The first processing unit increments the histogram corresponding to the difference by "1". In this case, the third processing unit calculates the following equation for the expectation function value:

$$T(f)=2f\Sigma H(d_f)/\{n(n-1)-2H(0)\}$$

where T(f) is the expectation function value for the value f, $d_f$ is the absolute value of the position difference having the value f as a divisor, $H(d_f)$ is the histogram for the absolute value of the position difference $d_f$, H(0) is the histogram for the absolute value of the position difference of "0", and n is the number of the fail bits.

Also, the second processing unit determines whether each of the fail bits is within a specified region, and repeatedly activates the first processing unit to all combinations of two of all the fail bits within the specified region in the bit map. The failure analysis apparatus may further includes: an input unit used to specify the specified region.

Also, the fourth processing unit determines that the fail bits has the regularity for the value, when the expectation function value for the value is larger than "1".

In order to achieve a fifth aspect of the present invention, a failure analysis apparatus of a semiconductor memory device, includes: a first processing unit which determines whether a position of each of fail bits of a two-dimensional bit map is within a specified region while updating a first histogram for the position, the bit map indicating a map of fail bits and each fail bit corresponding to a fail memory cell; a second processing unit which calculates an absolute value of a position difference between two of the fail bits within the specified region while updating a second histogram for the absolute value of the position difference with the first histograms for the two fail bits; a third processing unit which repeatedly activates the second processing unit to all combinations of two of the fail bits within the specified region: a fourth processing unit which calculates an expectation function value for each of values from the first and second histograms and the number of the fail bits within the specified region; and a fifth processing unit which determines whether the fail bits within the specified region has regularity or irregularity for each value, based on the calculated expectation function value for the value.

The second processing unit calculates the absolute value of the position difference in X- or Y coordinate.

Also, the first processing unit increments the first histogram for the fail bit within the specified region by "1". In this case, the second processing unit increments the second histogram for the absolute value of the position difference by a product of the first histograms for the two fail bits within the specified region. Also, the fourth processing unit calculates the following equation for the expectation function value:

$$T(f)=2f\Sigma H(d_f)/(n^2-\Sigma W^2)$$

where T(f) is the expectation function value for the value f, $d_f$ is the absolute value of the position difference having the value f as a divisor, $H(d_f)$ is the second histogram for the absolute value of the position difference $d_f$, W is each of the first histograms, and n is the number of the fail bits within the specified region.

The failure analysis apparatus may further includes: an input unit used to specify the specified region. Also, the fifth processing unit determines that the fail bits within the specified region has the regularity for the value, when the expectation function value for the value is larger than 1.

In order to achieve a sixth aspect of the present invention, a failure analysis apparatus of a semiconductor memory device, includes: a first processing unit which determines whether a position of each of fail bits of a two-dimensional bit map is within a specified region while updating a first histogram for the position, the bit map indicating a map of fail bits, each fail bit corresponding to a fail memory cell, and the fail bit within the specified region being a regional fail bit; a second processing unit which carries out first calculation of an absolute value of a position difference between two regional fail bits while incrementing a second histogram for the absolute value of the position difference by a first value, repeatedly carrying out the first calculation of the absolute value of the position difference to all combinations of two of the regional fail bits, and carries out second calculation of a first expectation function value for each of values from the second histograms and the number of the regional fail bits; a third processing unit which carries out third calculation of the absolute value of the position difference between two of the regional fail bits while incrementing a third histogram for the absolute value of the position difference by a second value which is determined based on the first histograms for the two regional fail bits, repeats the third calculation to all combinations of two of the regional fail bits, and carries out fourth calculation of a second expectation function value for the value from the first and second histograms and the number of the regional fail bits; a fourth processing unit which selectively activates one of the second and third processing units based on an execution time of the second processing unit and an execution time of the third processing unit; and a fifth processing unit which determines whether the regional fail bits has regularity or irregularity for each value, based on the calculated expectation function value for the value.

Each of the second and third processing units carries out the first or third calculation of the absolute value of the position difference in X- or Y coordinate.

Also, the first processing unit increments the first histogram for the regional fail bit by "1". In this case, the second processing unit calculates the following equation for the first expectation function value:

$$T(f)=2f\Sigma H(d_f)/\{n(n-1)-2H(0)\}$$

where T(f) is the calculated first expectation function value for the value f, $d_f$ is the absolute value of the position difference having the value f as a divisor, $H(d_f)$ is the second histogram for the absolute value of the position difference $d_f$, H(0) is the second histogram for the absolute value of the position difference of "0", and n is the number of the regional fail bits.

Alternatively, the third processing unit increments the third histogram for the absolute value of the position difference by a product of the first histograms for the two regional fail bits. In this case, the third processing unit calculates the following equation for the second expectation function value:

$$T(f)=2f\Sigma H(d_f)/(n^2-\Sigma W^2)$$

where T(f) is the second expectation function value for the value f, $d_f$ is the absolute value of the position difference having the value f as a divisor, $H(d_f)$ is the third histogram for the absolute value of the position difference $d_f$, W is each of the first histograms, and n is the number of the regional fail bits.

Also, the failure analysis apparatus may further includes: an input unit used to specify the specified region.

The fifth processing unit determines that the fail bits within the specified region has the regularity for the value, when the calculated expectation function value for the value is larger than "1".

In order to achieve a seventh aspect of the present invention, a recording medium which stores a program for a failure analysis method of a semiconductor memory device. The failure analysis method is attained by (a) calculating an absolute value of a position difference between two fall bits of a two-dimensional bit map while updating a histogram corresponding to the absolute value of the position difference, the bit map indicating a map of fail bits and each fail bit corresponding to a fail memory cell; by (b) repeating the (a) calculating to all combinations of two of the fail bits in the bit map; by (c) calculating an expectation function value for each of values from the histograms and the number of the fail bits; and by (d) determining whether the fail bits has regularity or irregularity for each value, based on the calculated expectation function value for the value.

In order to achieve an eighth aspect of the present invention, a recording medium which stores a program for a failure analysis method of a semiconductor memory device. The failure analysis method is attained by (a) determining whether a position of each of fail bits of a two-dimensional bit map is within a specified region while updating a first histogram for the position, the bit map indicating a map of fail bits and each fail bit corresponding to a fail memory cell; by (b) calculating an absolute value of a position difference between two of the fail bits within the specified region while updating a second histogram for the absolute value of the position difference with the first histograms for the two fail bits; by (c) repeating the (b) calculating to all combinations of two of the fail bits within the specified region; by (d) calculating an expectation function value for each of values from the first and second histograms and the number of the fail bits within the specified region; and by (e) determining whether the fail bits within the specified region has regularity or irregularity for each value, based on the calculated expectation function value for the value.

In order to achieve a ninth aspect of the present invention, a recording medium which stores a program for a failure analysis method of a semiconductor memory device. The failure analysis method is attained by (a) determining whether a position of each of fail bits of a two-dimensional bit map is within a specified region while updating a first histogram for the position, the bit map indicating a map of fail bits, each fail bit corresponding to a fail memory cell, and the fail bit within the specified region being a regional fail bit; by (b) carrying out first calculation of an absolute value of a position difference between two regional fail bits while incrementing a second histogram for the absolute value of the position difference by a first value, repeating the first calculation to all combinations of two of the regional fail bits, and carrying second calculation of a first expectation function value for each of values from the second histograms and the number of the regional fail bits; by (c) carrying out third calculation of the absolute value of the position difference between two of the regional fail bits while incrementing a third histogram for the absolute value of the position difference by a second value which is determined based on the first histograms for the two regional fail bits, repeating the third calculation to all combinations of two of the regional fail bits, and carrying out fourth calculation of a second expectation function value for the value from the first and second histograms and the number of the regional fail bits; by (d) selectively executing one of the (b) and the (c) based on an execution time of the (b) and an execution time of the (c); and by (e) determining whether the regional fail bits has regularity or irregularity for each value, based on the calculated expectation function value for the value.

DESCRIPTION OF THE PREFERRED EMBODIMENTS

Figure 1A:
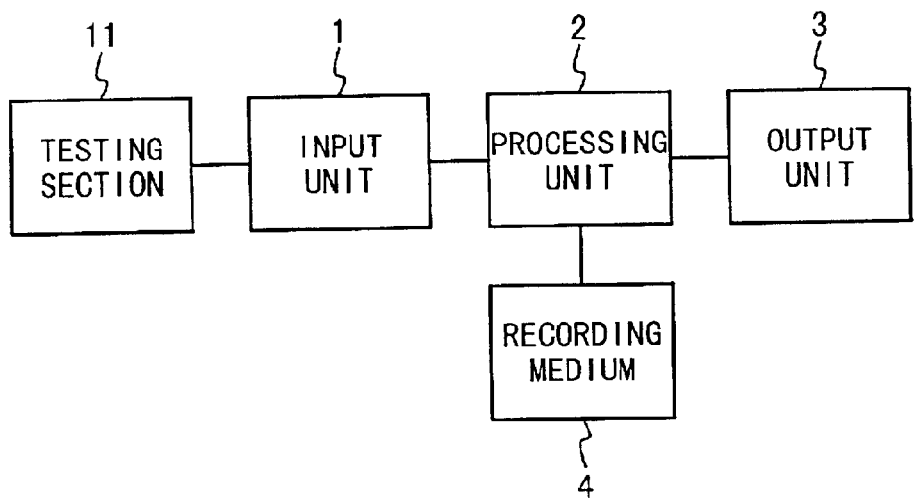
FIG. 1A is a block diagram showing the whole structure of a semiconductor memory device failure analysis system of the present invention.

Hereinafter, a semiconductor memory device failure analysis system of the present invention will be described with reference to the attached drawings. It should be noted that the same components in the respective drawings are allocated with the same reference numerals or symbols, respectively.

FIG. 1 is a block diagram showing the whole structure of the semiconductor memory device failure analysis system according to the first embodiment of the present invention. The semiconductor memory device failure analysis system in the first embodiment is composed of a testing section 11, an input unit 1, a processing unit 2, an output unit 3 and a medium driver for a recording medium 4. The processing unit 2 reads a program for a semiconductor memory device failure analysis from the recording medium and attains various processing functions.

Figure 1B:
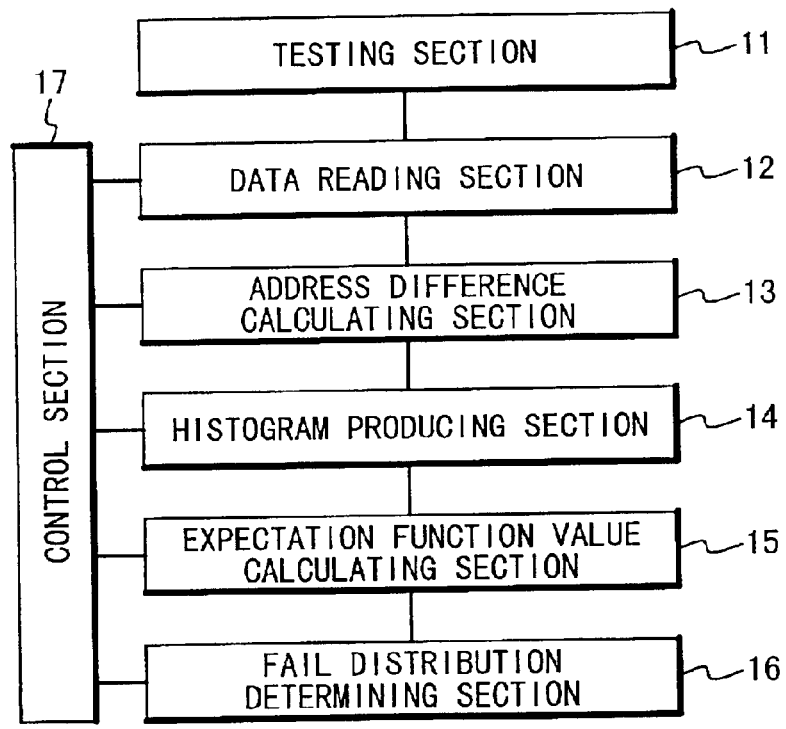
FIG. 1B is a block diagram showing the structure of the semiconductor memory device failure analysis system according to a first embodiment of the present invention.
Figure 2:
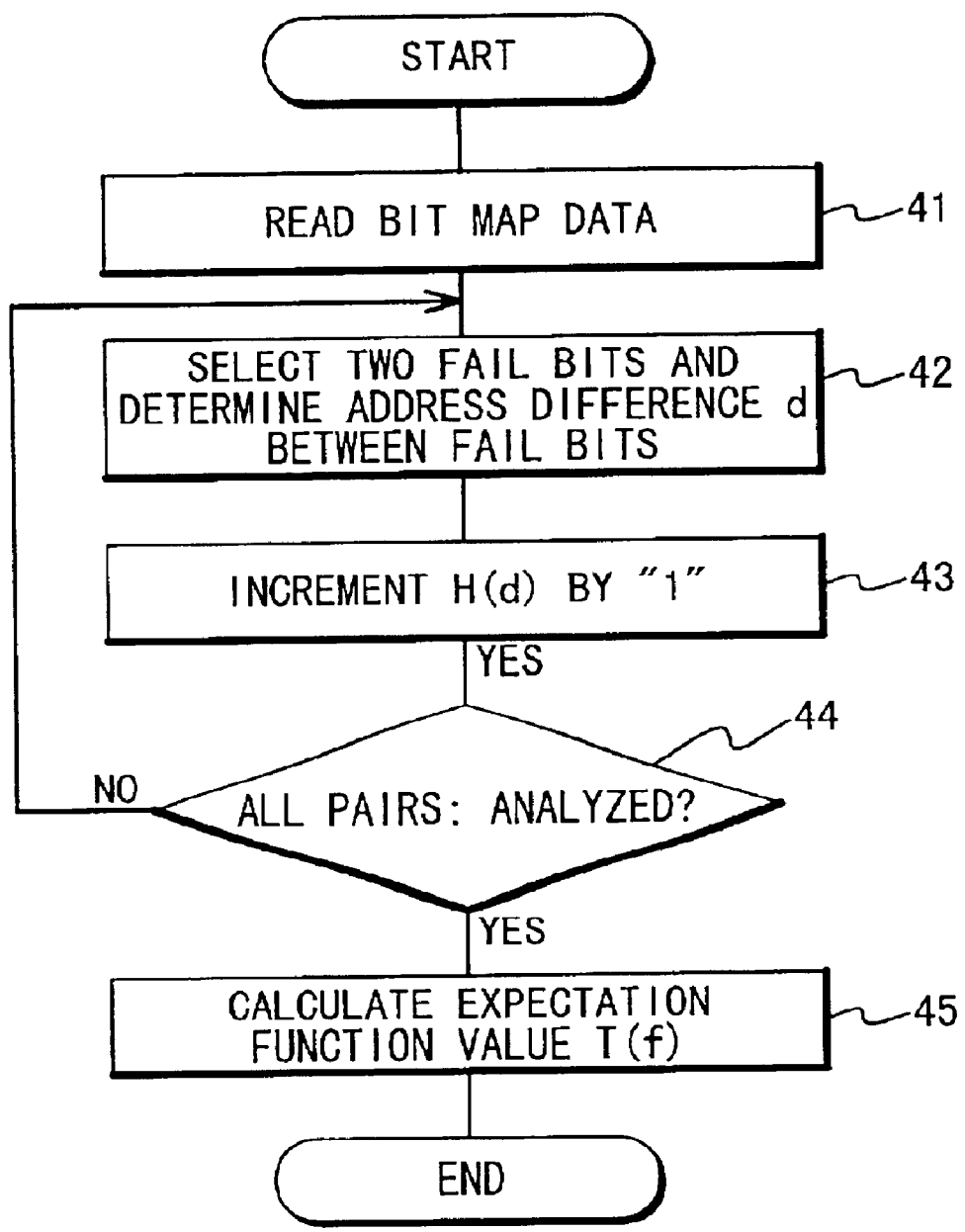
FIG. 2 is a flow chart showing a processing flow of the failure analysis in the semiconductor memory device failure analysis system according to the first embodiment of the present invention.

FIG. 1B is a functional block diagram showing the structure of the semiconductor memory device failure analysis system according to the first embodiment of the present invention. Also, FIG. 2 is a flow chart showing the processing flow of the failure analysis in the failure analysis system shown in 1.

First, referring to FIG. 1B the semiconductor memory device failure analysis system in the first embodiment is composed of a testing section 11, a data reading section 12, an address difference calculating section 13, a histogram producing section 14, an expectation function value calculating section 15, a fault distribution determining section 16, and a control section 17. The data reading section 12 corresponds to the input unit 1. Also, the address difference calculating section 13, the histogram producing section 14, the expectation function value calculating section 15, the fault distribution determining section 16 and the control section 17 are configured by the processing unit 2. The control section 17 controls the operation of failure analysis system.

The testing section 11 carries out test to the semiconductor memory device as an analysis object and stores the test result in its storage section as a bit map data. In the semiconductor memory device, memory cells are arranged with predetermined intervals in matrix. When the memory cell is in failure, the memory cell is represented as a fail bit or dot in the bit map data.

The data reading section 12 reads the above bit map data, and holds the coordinate data of each of fail bits on a memory of the processing unit 2. The address difference calculating section 13 selects two fail bits, a and b, from among the read fail bits in response to a select instruction from the control section 17, and calculates a address difference or a distance d(a, b) between addresses or positions of fail bits a and b. The method of calculating the address difference depends on the kind of the analysis. However, when an X address analysis is carried out, the address difference can be calculated as an absolute value of the difference between the X coordinate values of the fail bits a and b. That is, when the X coordinate values of the fail bits a and b are a(x) and b(x), respectively, $$d(a, b) = |a(x) - b(x)|$$

is calculated. In case of Y address analysis, the address difference is calculated as an absolute value of the difference between the Y coordinate values of the fail bits a and b. That is, when the Y coordinate values of the fail bits a and b are a(y) and b(y), respectively, $$d(a, b) = |a(y) - b(y)|$$

is calculated.

The histogram producing section 14 carries out an adding process to produce a histogram H(d) for the address difference d. More specifically, the histogram H(d(a, b)) is incremented by "1" for a single pair of the fail bits a and b.

The processes by the address difference calculating section 13 and the histogram producing section 14 are carried out to all the pairs of the fail bits in response to a calculation instruction and an update instruction from the control section 17, respectively. Thus, the address difference histogram H(d) is finally obtained.

The expectation function value calculating section 15 calculates an expectation function value T(f) based on the above address difference histogram H(d) and the number of fail bits. The expectation function value shows the regularity of the distribution of fail bits. It is supposed that a sufficient lot of fail bits are completely randomly distributed. In this case, the value of the expectation function value becomes "1". On the other hand, it is supposed that the fail bits are only located in even numbered coordinate values. In this case, because the address difference always becomes a multiple of 2, the expectation function values at the values of 2, 4, 6 . . . exceed "1" largely. Therefore, it is possible to estimate the regularity of the distribution of fail bits.

The fail distribution determining section 16 carries out the determination of the regularity or irregularity of the distribution of fail bits based on the expectation function value T(f) in response to a determination instruction from the control section 17. That is, the fail distribution determining section 16 determines that fail bits with the regularity exist, when there is a factor f such a manner that the expectation function value T(f) exceeds "1". Also, the fail distribution determining section 16 determines to be the fail bits with the irregularity, when the expectation function values T(f) is less than "1" for all the factors f. The fail distribution determining section 16 outputs the determination result to the output unit 3.

Here, the expectation function value T(f) is the function which is defined by the following equation:

$$T(f) = f \Sigma m(f)/(N-ux)$$

where Σm(f) is the number of combinations in which the address difference d has the factor f when optional two are selected from the fail bits, N is the number of combinations when the optional two are selected from the fail bits, ux is the number of combinations having the address difference of d=0 when the optional two are selected from the fail bits. Therefore, when the maximum address difference between the fail bits is max(d), and the number of fail bits is n, $$N = n(n-1)/2$$

$$ux = H(0)$$

Therefore, the expectation function value T(f) is determined from the following equation (A) based on address difference histogram H(d):

$$T(f) = 2f/\{n(n-1) - 2H(0)\} \times \Sigma H(f_j) \quad (A)$$

where the addition of ΣH(f_j) is carried out to j in a range of 1 to j' ($f_j \leq \max(d)$).

Next, the processing flow of the semiconductor memory device failure analysis system shown in FIG. 1B will be described with reference to FIG. 2.

Referring to FIG. 2, the bit map data of fail bits is read (Step 41). Optional two are selected from the fail bits of the read bit map data and the address difference d is calculated (Step 42). Then, address difference histograms H(d) for the selected two fail bits is updated or incremented by "1" (Step 43). The above processes is repeatedly carried out to all of the pairs of the fail bits (Step 44→42 . . . ). Thus, when the above processes are ended for all of the pairs of the fail bits, the expectation function value T(f) is calculated (Step 45).

The above-mentioned processes by the address difference calculating section 13 to the expectation function calculating section 15 will be described with reference to a specific example. In the specific example, the X address analysis is carried out to 6 fail bits, A(101,1), B(101,3), C(101,6), D(103,2), E(103,3) and F(105,1) to the maximum factor of "4". The processing to the specific example at this time will be described with reference to FIG. 3.

The calculation of address difference d and the production of an address difference histogram are as follows:

A-B: d(A,B)=|101−101|=0→adds 1 to H(0);
A-C: d(A,C)=|101−101|=0→adds 1 to H(0);
A-D: d(A,D)=|101−103|=2→adds 1 to H(2);
A-E: d(A,E)=|101−103|=2→adds 1 to H(2);
A-F: d(A,F)=|101−105|=4→adds 1 to H(4);
B-C: d(B,C)=|101−101|=0→adds 1 to H(0);
B-D: d(B,D)=|101−103|=2→adds 1 to H(2);
B-E: d(B,E)=|101−103|=2 →adds 1 to H(2);
B-F: d(B,F)=|101−105|=4 →adds 1 to H(4);
C-D: d(C,D)=|101−103|=2→adds 1 to H(2);
C-E: d(C,E)=|101−103|=2→adds 1 to H(2);
C-F: d(C,F)=|101−105|=4 →adds 1 to H(4);
D-E: d(D,E)=|103−103|=0→adds 1 to H(0);
D-F: d(D,F)=|103−105|=2→adds 1 to H(2); and
E-F: d(E,F)=|103−105|=2→adds 1 to H(2).

Figure 4:
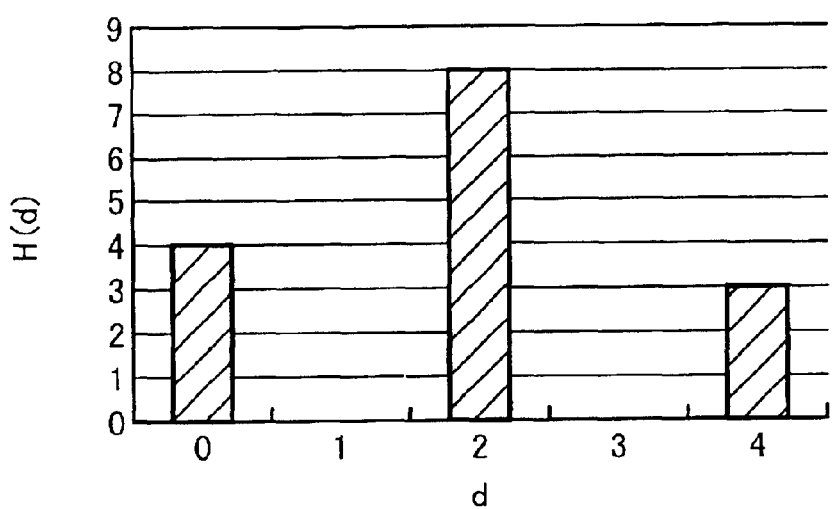
FIG. 4 is a diagram showing the address difference histogram generated when the distribution data shown in FIG. 3 is analyzed by the semiconductor memory device failure analysis system according to the first embodiment of the present invention.

As a result, the address difference histogram H(d) is produced as shown in FIG. 4.

As understood from the above, the number of fail bits is n=6, the number of pairs having address difference of "0" is H(0)=4, and the maximum address difference is max(d)=4. Therefore, the expectation function can be calculated as follows:

$$T(2) = (H(2) + H(4)) \times 2 \times 2/(6 \times 5 - 2 \times 4)$$
$$= 44/22$$
$$= 2.00$$

$$T(3) = H(3) \times 2 \times 3/(6 \times 5 - 2 \times 4)$$
$$= 0$$

$$T(4) = H(4) \times 2 \times 4/(6 \times 5 - 2 \times 4)$$
$$= 24/22$$
$$= 1.09$$

Next, the algorithm of the present invention is compared with the conventional algorithm. The flow chart of the general failure analysis algorithm is shown in FIG. 5.

Figure 5:
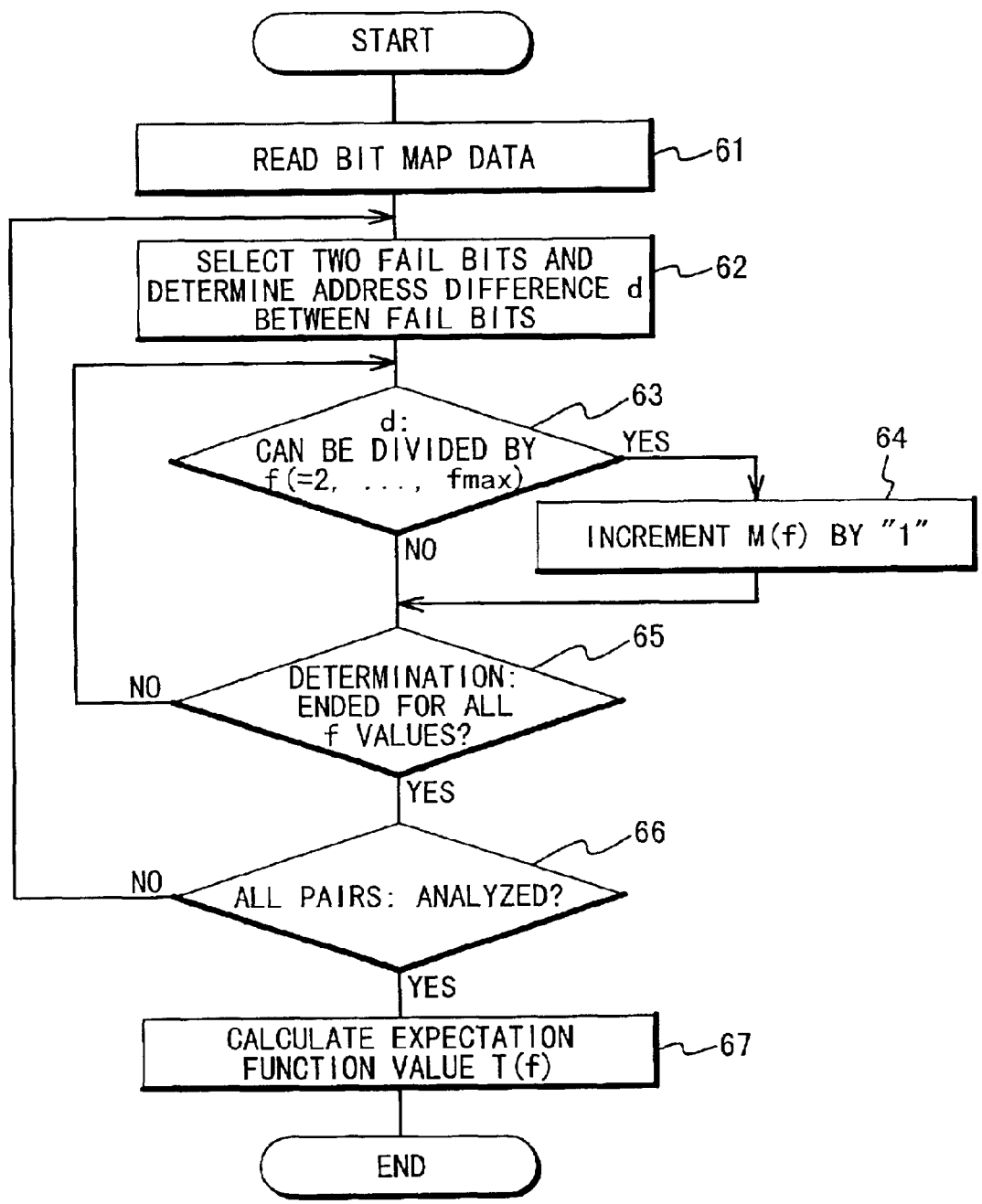
FIG. 5 is a flow chart showing the processing flow of a conventional failure analysis.

In the algorithm which is shown in FIG. 5, after a bit map data is read (Step 61), two fail bits are selected from the bit map data, and address difference d is calculated (Step 62). Whether or not the value of the address difference d has a factor f in a range of 2 to fmax is determined (Step 63). When the value of the address difference d has a factor f, a function M(f) is incremented by "1" (step 64). On the other hand, when the value of the address difference d does not have any factor f in a range of 2 to fmax, the processing is continued just as it is. The steps 63 and 64 are repeatedly executed to all the factors f (Step 65→63 . . .).

The above processing is repeatedly carried out until all of the pairs of the fail bits are analyzed (Step 66→62 . . . ). After all of the pairs of the fail bits are analyzed, the expectation function T(f) is calculated (Step 67).

In short, whether or not the address difference d has the factor f is checked each time the address difference d is calculated. Therefore, the processing of the loop of the steps 62 to 66 in FIG. 5 is carried out $_nC_2$ time.

It should be noted that the function M(f) in the step 64 indicates the frequency Σm(f) of the factor f. This frequency is defined as follows. That is, it is supposed that the X-coordinate address difference of fail bits a and b is "6". In this case, the address difference has divisors of "2", "3" and "6", which are kinds of divisors.

In this way, with respect to all the pair of fail bits, the address difference is first calculated, and what divisor the address difference has next is examined. Thus, the number of pairs having the divisor of "2", the divisor of "3", or the divisor of "6" is determined. This number of pairs is a "frequency".

The above-mentioned factor checking process (Step 63) is carried out to all of the factors f from "2" to "fmax" (fmax is the maximum value of the factor f when the factor checking process is carried out). Therefore, the load of the process is heavy, and if the process is repeatedly carried $_nC_2$ times, the analysis time is increased largely.

On the other hand, in the algorithm shown in FIG. 2, when the address difference d is calculated to a pair of the fail bits, the histogram of the address difference is only incremented for the fail bits (Step 43 of FIG. 2). After that, when the expectation function value T(f) is determined (step 45 of FIG. 2), the factor checking process is carried out at the same time.

The above-mentioned processing is carried out at most 1000 times in case of f=2 and Max(d)=2000. Even if the factor f becomes large, the load of the processing is light. For example, in the above equation (A), ΣH(2j) is the adding process of 1000 times from j=1 to 2j≦2000. If f=1000, ΣH(1000j) is the adding process which is carried out only twice to 1000j≦2000. Therefore, in the algorithm shown in FIG. 2, the factor checking process (the steps 62 to 66 of FIG. 5) with the heavy load in the algorithm of FIG. 5 can be removed so that the increase of the analysis time can be restrained.

However, it should be noted that because the process (the steps 42 to 44 of FIG. 2) from calculation of the address difference d to the production of the histogram H(d) is carried out for all the combinations of the pairs of fail bits, the process is carried out $_nC_2$ times. Thus, the whole analysis time is proportional to the square of the number of fail bits.

Next, the semiconductor memory device failure analysis system according to the second embodiment of the present invention will be described with reference to FIG. 6. Also, the processing flow is shown in the flow chart of FIG. 7.

Figure 6:
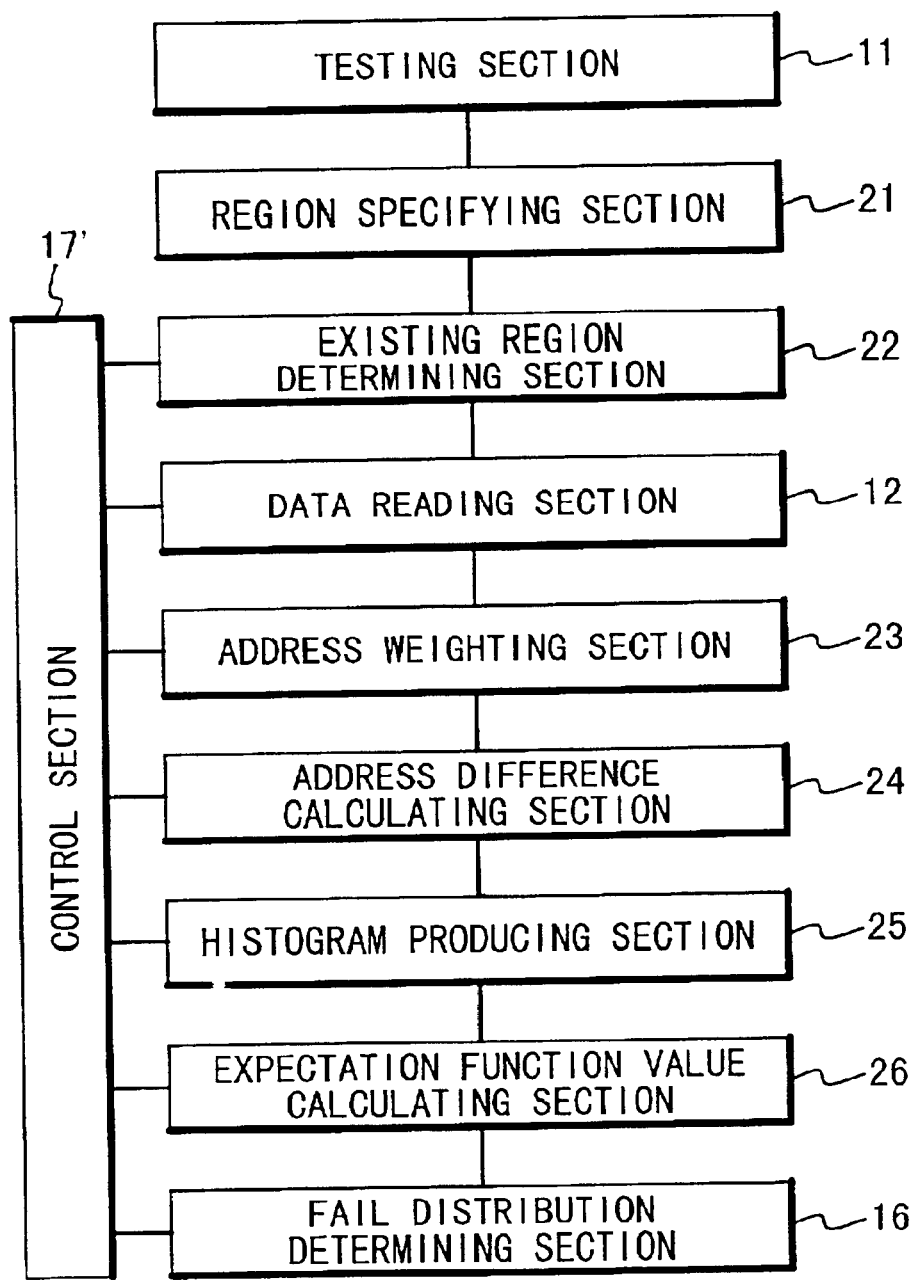
FIG. 6 is a block diagram showing the structure of the semiconductor memory device failure analysis system according to a second embodiment of the present invention.

First, referring to FIG. 6, the semiconductor memory device failure analysis system in the second embodiment is composed of the testing section 11, a region specifying section 21, an existing region determining section 22, the data reading section 12, the address weighting section 23, an address difference calculating section 24, a histogram producing section 25, an expectation function value calculating section 26, a fail distribution determining section 16, and a control section 17'. The existing region determining section 22, the address weighting section 23, the address difference calculating section 24, the histogram producing section 25, the expectation function value calculating section 26, the fail distribution determining section 16, and the control section 17' are configured in the processing unit 2. The control section 17' controls the whole structure of the semiconductor memory device failure analysis system.

The testing section 11 carries out an electric test to the semiconductor memory device as an analysis object and stores the test result in its storage as a bit map data.

The region specifying section 21 specifies the region of a LSI chip for the failure analysis. More specifically, a rectangular region is specified as the analysis region to have the lower limit x1 and the upper limit x2 in the x-coordinate, and the lower limit y1 and the upper limit y2 in the y coordinate. The existing region determining section 22 determines whether or not each fail bit of the bit map data is in the region specified by the region specifying section 12. More specifically, the fail bit is determined to be in the analysis region, if the x address of the fail bit is between x1 and x2 and the y address thereof is between y1 and y2.

The data reading section 12 reads out the bit map data stored in the testing section 11. When the each fail bit of the bit map data is determined to be in the region by the existing region determining section 22, the coordinate data of the fail bit is held on its memory of the system. In case of reading of the above bit map data, an address weighting section 23 adds the histogram by "1" to carry out the weighting process. For example, in case of the X-coordinate address analysis, the weighted histogram W(p(x)) is incremented by "1", when the weighted histogram is W(i) with respect to the X coordinate i, and the X-coordinate value of the fail bit p is p(x). Thus, the production of the above weighted histogram W(i) is completed at the time when whole of bit map data as the analysis object is read out.

The address difference calculating section 24 selects two fail bits a and-b from among the analyzed address space, and calculates the address difference d(a,b)=|a−b| (difference between two X-coordinate values in case of X address analysis).

The histogram producing section 25 produces the histogram H(d) for the address difference. An address weighting product, i.e., W(a)W(b) is added to the histogram H(d(a,b)) for the address difference d(a,b) calculated by the above address difference calculating section 24. The processing of the above calculation of the address difference and histogram production is carried out to all the combinations of coordinate values in the address space. Therefore, when the size of the address space is 1, the above-mentioned processing is carried out $_1C_2$ times. It should be noted that if an X address analysis is carried out for the analysis region of s≦x≦t, the address space size is 1=t−s+1.

Next, the expectation function calculating section 26 determines the expectation function T(f)=fΣm(f)/(N−ux). Because the number ux of combinations having the address difference is "0" is equal to the number of pairs of fail bits having the same coordinate values, $$ux = \sum_{W(i)} C_2.$$

Figure 3:
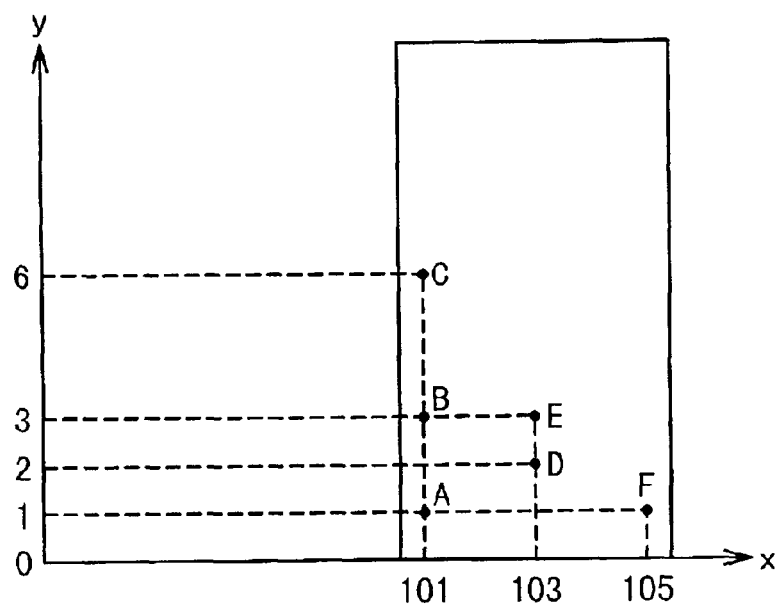
FIG. 3 is a diagram a diagram showing an example of data indicative of a distribution of fail bits.

For example, W(101)=3 in FIG. 3 and the address differences of the three pairs of A and B, A and C, and B and C are "0". At this time, the number of pairs of fail bits having the coordinate values of x=101 is $$_{w(101)}C_2 = {_3}C_2 = 3$$

Also, because ΣW(i)=n at this time, the number N−ux of combinations which are effective in the failure analysis is:

$$_nC_2 - \sum_{W(i)} C_2 = n(n-1)/2 - \sum W(i)(W(i)-1)/2$$

$$= \left(n2 - n - \sum W(i)2 + \sum W(i)\right)/2$$

$$= \left(n2 - \sum W(i)2\right)/2$$

Therefore, when the maximum address difference is Max(d), and the number of fail bits is n, the expectation function value T(f) can be determined from the following equation (B):

$$T(f) = 2f / \{n^2 - \Sigma W(i)^2\} \times \Sigma H(f_j) \quad (B)$$

Here, the adding process of $\Sigma H(f_j)$ is carried out to j in a range of "1" to j' ($f_{j'} \leq \max(d)$).

Next, the processing flow of the semiconductor memory device failure analysis system of FIG. 6 will be described with reference to FIG. 7.

Figure 7:
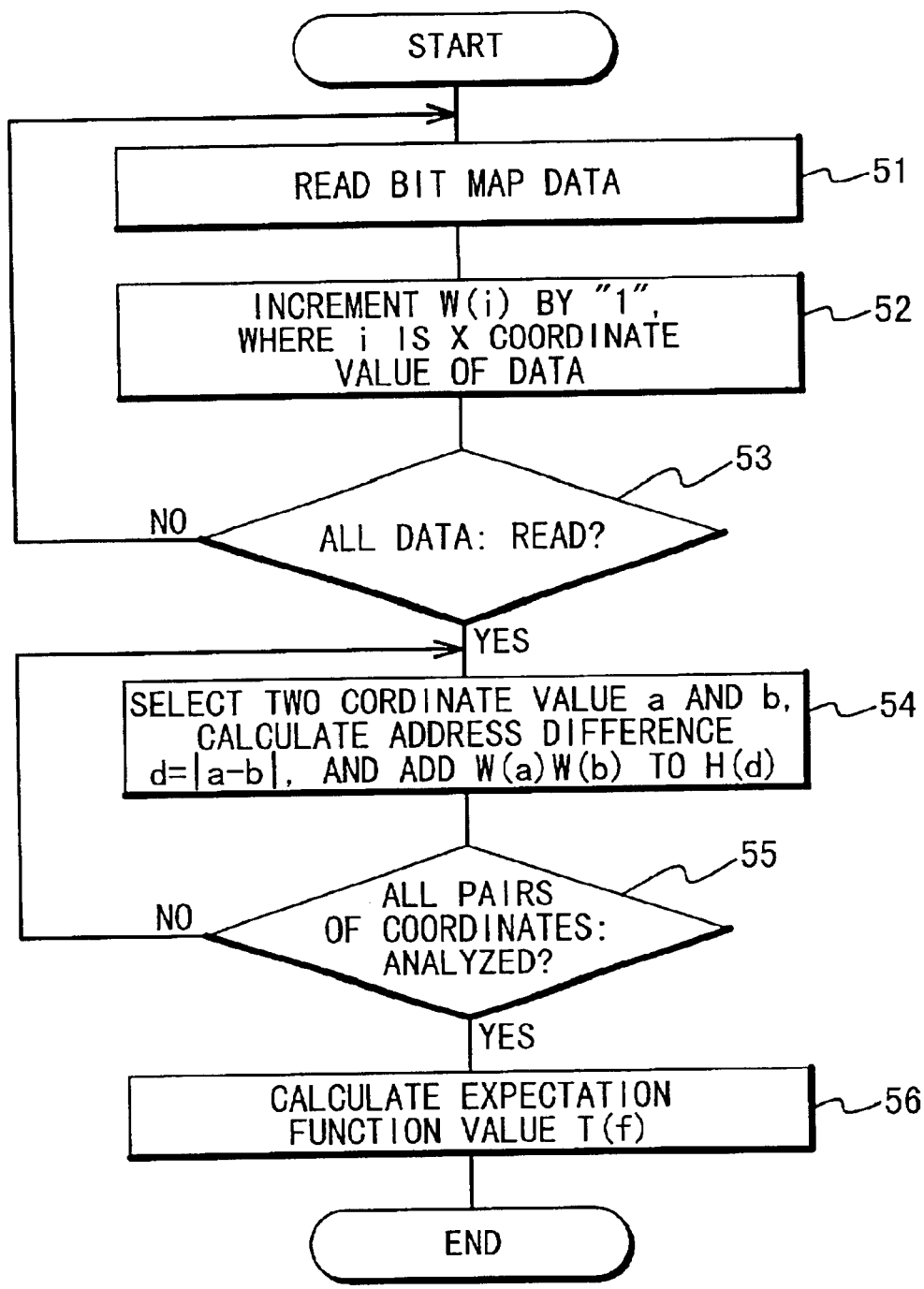
FIG. 7 is a flow chart showing the processing flow of the failure analysis by the semiconductor memory device failure analysis system according to the second embodiment of the present invention.

Referring to FIG. 7, a bit map data is first read (Step 51). Then, the histogram W(i) is incremented by "1" for the X coordinate value of i of the read bit map data for a weighting process (Step 52). The above process is repeatedly carried out until all the fail bits is read out from the bit map data (Step 53→51 . . . ).

Next, two coordinate values a and b are selected and the address difference d=|a−b| is calculated. Then, the product W(a)W(b) is added to the histogram H(d) (Step 54). The step 54 is repeatedly carried out until the analysis completes for all the pair of coordinate values (Step 55→54 . . . ). When analyses of all the pair of the coordinate values completes, the expectation function value T(f) is calculated (Step 56).

The process from the processing by the above address difference calculating section 24 to the processing by the expectation function calculating section 26 will be described using a specific example.

It is supposed that the X-coordinate analysis is carried out to six fail bits A(101,1), B(101,3), C(101,6), D(103,2), E(103,3), and F(105,1) to the factor of "4" (see FIG. 3). It should be noted that the analysis region (x,y)=(101,0)–(105, 9999), and the address weighting process is as follows.

A: A(x)=101→add 1 to W(101);
B: B(x)=101→add 1 to W(101):
C: C(x)=101→add 1 to W(101);
D: D(x)=103→add 1 to W(103);
E: E(x)=103→add 1 to W(103); and
F: F(x)=105→add 1 to W(105).

Figure 8:
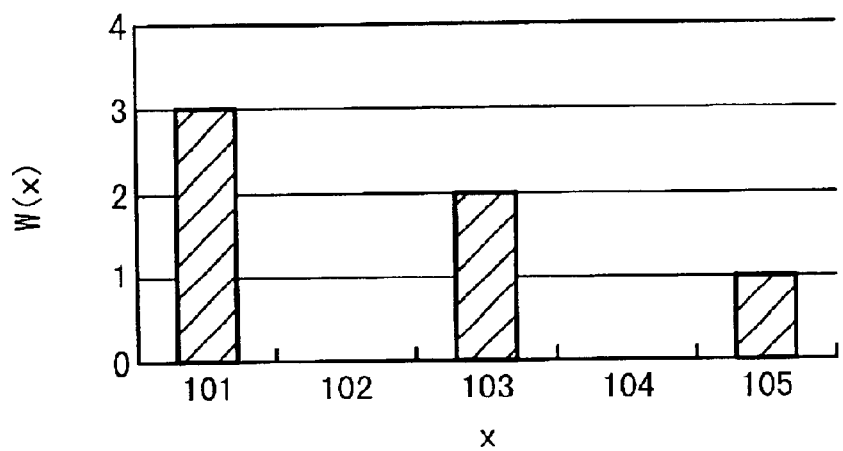
FIG. 8 is a diagram showing a address weighted histogram generated when the distribution data shown in FIG. 3 is analyzed by the semiconductor memory device failure analysis system according to the second embodiment of the present invention.

As a result, the weighted histogram W(x) to each coordinate value is determined. The histogram obtained in this way is shown in FIG. 8.

Next, two X-coordinate values a and b are selected from among the address space (101≦x≦105) and the weighting product W(a)W(b) for the coordinate values is added for the address difference d=|a−b| of the pair. In this way, the histogram H(d) of the address difference d is produced.

101–102: add W(101)W(102) to |101−102|, i.e., "0" to H(1);
101–103: add W(101)W(103) to |101−103|, i.e., "6" to H(2);
101–104: add W(101)W(104) to |101−104|i.e., "0" to H(3);
101–105: add W(101)W(105) to |101−105|, i.e., "3" to H(4);
102–103: add W(102)W(103) to |102−103|, i.e., "0" to H(1);
102–104: add W(102)W(104) tol |102−104|, i.e., "0" to H(2);
102–105: add W(102)W(105) to |102−105|, i.e., "0" to H(3);
103–104: add W(103)W(104) to |103−104|, i.e., "0" to H(1);
103–105: add W(103)W(105) to |103−105|, i.e., "2" to H(2); and
104–105: add W(104)W(105) to |104−105|, i.e., "0" to H(1).

Figure 9:
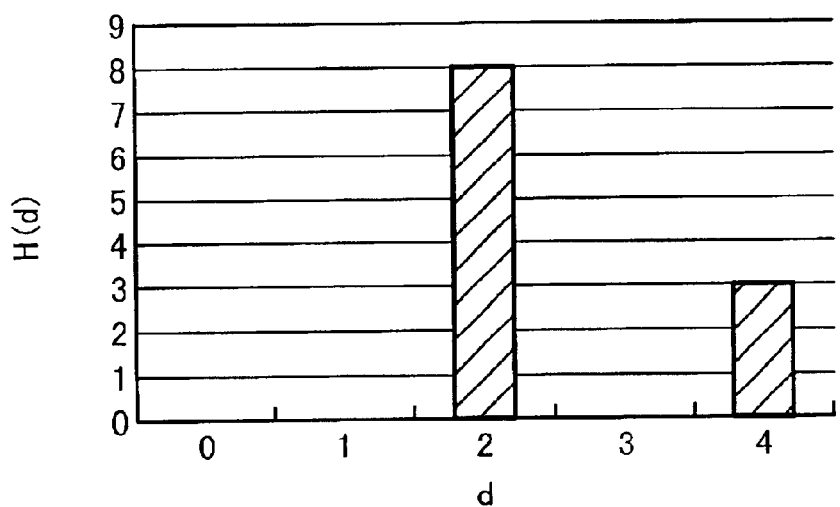
FIG. 9 is a diagram showing an address difference histogram generated when the distribution data shown in FIG. 3 is analyzed by the semiconductor memory device failure analysis system according to the second embodiment of the present invention.

The histogram obtained in this way is shown in FIG. 9. Comparing the histogram shown in FIG. 9 with the histogram shown in FIG. 4, the value of the histogram H(0) is different. However, because the address differences of "0" is not the analysis object originally, the difference of the histogram value does not influence analysis result T(f).

Here, the numbers of the fail bits is n=6, and $\Sigma W(i)2=9+0+4+0+1=14$. Therefore, the expectation function value T(f) can be determined as follows.

$$T(2) = (H(2) + H(4)) \times 2 \times 2/(6 \times 6 - 14)$$
$$= 44/22$$
$$= 2.00$$
$$T(3) = H(3) \times 2 \times 3/(6 \times 6 - 14)$$
$$= 0$$
$$T(4) = H(4) \times 2 \times 4/(6 \times 6 - 14)$$
$$= 24/22$$
$$= 1.09$$

The failure analysis algorithms in the above first and second embodiments of the semiconductor memory device failure analysis system will be compared. As for the data reading process (the step 41 in FIG. 2 and the steps 51 and 52 in FIG. 7), the second embodiment of FIG. 6 in which it is necessary to carry out the address weighting process (the step 52 of FIG. 7) is heavy rather than the first embodiment. However, the address weighting processing itself is merely an adding process and the increase of the load is small.

The largest difference point is in the producing process of the address difference histogram H(d) (the steps 42 and 43 of FIG. 2 and the step 54 of FIG. 7). When the processing content itself is substantially the same between the first and second embodiment. However, the process is carried out $_nC_2$ times in the system of FIG. 1 when the number of fail bits is n, while the process is carried out $_1C_2$ times in the system of FIG. 6 when the size of the address space is 1. Therefore, the failure analysis time in the system of FIG. 6 depends on the analyzed address space, and increases in proportional to the square of the address space size. However, because the processing load does not depend on the number of fail bits, the effect of the restraint of the analysis time is large when the number of fail bits is increased.

It should be noted that the region specifying section 21 and the existing region determining region 22 may be applied to the first embodiment.

Figure 10:
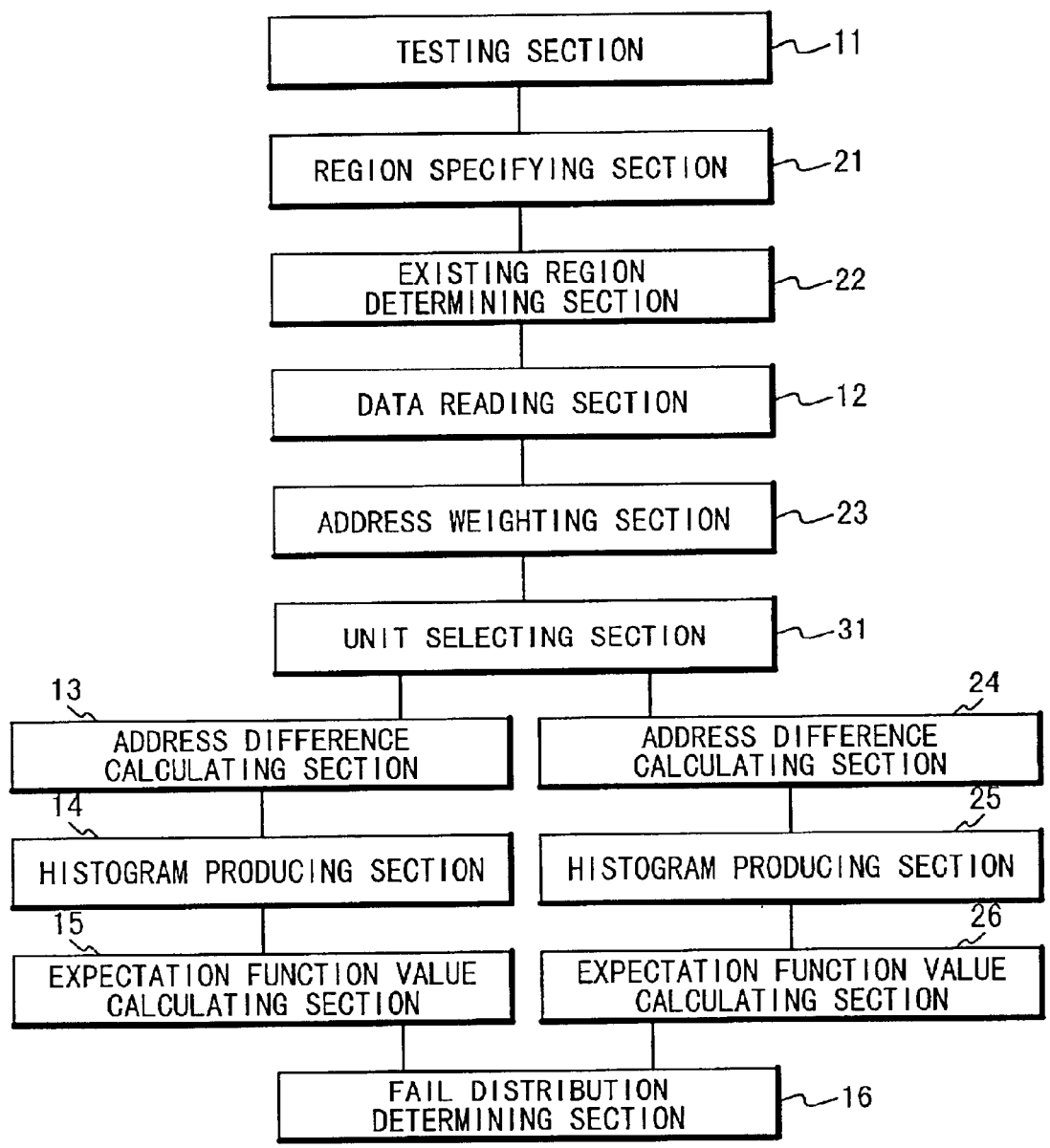
FIG. 10 is a block diagram showing the structure of the semiconductor memory device failure analysis system according to a third embodiment of the present invention.

Next, FIG. 10 is a block diagram of the semiconductor memory device failure analysis system according to the third embodiment of the present invention. In the third embodiment shown in FIG. 10, the testing section 11 to the fail distribution determining section 16 in FIG. 10 are same as those shown in FIG. 1. Also, the region specifying section 21 to the expectation function calculating section 26 in FIG. 10 are same as those shown in FIG. 6.

A unit selecting section 31 estimates the analysis time when the failure analysis is carried out using the system of FIG. 1 and the analysis time when the failure analysis is carried out using the system of FIG. 6 based on the number n of fail bits and the size 1 of the address space. Thus, the system selecting section 31 selects and carries out the failure analysis with the shorter estimated analysis time.

Next, a method of estimating the analysis time and a method of selecting the process will be described.

As mentioning above, the largest difference point between the system of FIG. 1 and the system of FIG. 6 is in the producing process of the address difference histogram H(d). If the processing time can be estimated, the analysis times of both can be compared. In the system of FIG. 1, the producing process is carried out $_nC_2$ time when the number of fail bits is n, whereas in the system of FIG. 6, the producing process is carried out $_lC_2$ time when the size of the address space is 1. Therefore, in the system of FIG. 1, the above processing time is proportional to the square of the fail bit number n and in the system of FIG. 6, it is proportional to the square of the size 1 of the address space.

In this way, the above processing time is previously measured in the system of FIG. 1. Thus, a coefficient A is predetermined in the relational expression S=An2 between the fail bit number n and the processing time S. Also, in the same way, in the system of FIG. 6, the value of coefficient B is predetermined in the relational expression T=B12 between the size 1 of the address space and the processing time T. At this time, $$S/T=(A/B)*(n/1)^2.$$

Therefore, if placing C=A/B and k–n/1, the processing time of the system of FIG. 1 and that of the system of FIG. 6 becomes equal to each other when $Ck^2=1$, i.e., $k=1/C^{1/2}$.

The unit selecting section 31 determines the value of k=n/1 from the fail bit number n and the size 1 of the address space. If k is equal to or less than $1/C^{1/2}$, the system is selected to the address difference calculating section 13 to the expectation function calculating section 15 in the system of FIG. 1. Otherwise, the system is selected to use the address difference calculating section 24 to the expectation function calculating section 26 in the system of FIG. 6.

It should be noted that the semiconductor memory device failure analysis as mentioned above can be carried out, if a recording medium in which a program to realize the process of FIG. 2 or FIG. 7 is recorded is provided. Various recording media can be used for this recording medium in addition to the semiconductor memory, a magnetic disk unit which are not shown in FIG. 1 or FIG. 6.

Also, if a computer is controlled by the program recorded on the recording medium, the semiconductor memory device failure analysis can be carried out as mentioned above.

In this case, the program to realize the processing of FIG. 2 is recorded in the recording medium such that the processing is composed of a first process to calculate an address difference between two fail bits of a bit map data in the test result of the semiconductor memory device, a second process to produce the histogram of the address difference based on the address difference, a third process to calculate an expectation function to the factors based on the address difference histogram, a fourth process to determine the regularity of the distribution of fail bits from the expectation function.

Also, A program to realize the processing of FIG. 7 is recorded in the recording medium such that the processing is composed of a first process to specify a region of the semiconductor memory device to be analyzed, a second process to determine whether or not the fail bit of the test result of the semiconductor memory device is in the specified region in case of the above first process, a third process to weight the address of the data when the data of the fail bit determined to be in the region in case of the second process is read, a fourth process to calculate an address difference between two addresses in the analysis region, a fifth process to produce the histogram of the address difference based on the address difference, a sixth process to calculate an expectation function to factors based on the address difference histogram, and a seventh process to determine the regularity of the distribution of fail bits from the expectation function.

As described above, according to the present invention, the factor checking process is carried out only once, compared with the execution of $_nC_2$ in the conventional system. Therefore, the analysis time can be remarkably reduced.

Also, the weighting process is carried out by use of the number of fail bits in the analysis region, and the process of all the combinations is carried out for not fail bits but the address to determine an expectation function. Therefore, the processing load does not depend on the number of fail bits. As a result, the effect of restraint of the analysis time is attained when the number of fail bits is increased.

Moreover, one of a plurality of systems is selected based on the ratio of a fail bit number n to the size 1 of address space. th8us, the failure analysis can be carried out based on an optimal algorithm determined based on the distribution of fail bits.

What is claimed is:

1. A failure analysis method of a semiconductor memory device, comprising:
    (a) calculating an absolute value of a position difference between two fail bits of a two-dimensional bit map while updating a histogram corresponding to said absolute value of said position difference, said bit map indicating a map of fail bits and each fail bit corresponding to a fail memory cell;
    (b) repeating said (a) calculating to all combinations of two of said fail bits in said bit map;
    (c) calculating an expectation function value for each of values from said histograms and the number of said fail bits, said expectation function value indicating regularity of said fail bits; and
    (d) determining whether said fail bits has regularity or irregularity for each value, based on said calculated expectation function value for said value.

2. A failure analysis method according to claim 1, wherein said (a) calculating includes:
    calculating said absolute value of said position difference in X- or Y-coordinate.

3. A failure analysis method according to claim 1, wherein said (a) calculating includes: incrementing said histogram corresponding to said difference by "1".

4. A failure analysis method according to claim 3, wherein said (c) calculating includes:
    calculating the following equation for said expectation function value:

$$T(f)=2f\Sigma H(d_f)/\{n(n-1)-2H(0)\}$$

where T(f) is said expectation function value for said value f, $d_f$ is said absolute value of said position difference having said value f as a divisor, $H(d_f)$ is said histogram for said absolute value of said position difference $d_f$, H(0) is said histogram for said absolute value of said position difference of "0", and n is the number of said fail bits.

5. A failure analysis method according to claim 1, wherein said (b) repeating includes:
    determining whether each of said fail bits is within a specified region; and
    repeating said (a) calculating to all combinations of two of all said fail bits within said specified region in said bit map.

6. A failure analysis method according to claim 5, further comprising:
    specifying said specified region.

7. A failure analysis method according to claim 1, wherein said (d) determining includes:

determining that said fail bits has said regularity for said value, when said expectation function value for said value is larger than "1".

8. A failure analysis method of a semiconductor memory device, comprising:

(a) determining whether a position of each of fail bits of a two-dimensional bit map is within a specified region while updating a first histogram for said position, said bit map indicating a map of fail bits and each fail bit corresponding to a fail memory cell;

(b) calculating an absolute value of a position difference between two of said fail bits within said specified region while updating a second histogram for said absolute value of said position difference with said first histograms for said two fail bits;

(c) repeating said (b) calculating to all combinations of two of said fail bits within said specified region;

(d) calculating an expectation function value for each of values from said first and second histograms and the number of said fail bits within said specified region, said expectation function value indicating regularity of said fail bits within said specified region; and (e) determining whether said fail bits within said specified region has regularity or irregularity for each value, based on said calculated expectation function value for said value.

9. A failure analysis method according to claim 8, wherein said (b) calculating includes:

calculating said absolute value of said position difference in X- or Y-coordinate.

10. A failure analysis method according to claim 8, wherein said (a) determining includes:

incrementing said first histogram for said fail bit within said specified region by "1".

11. A failure analysis method according to claim 10, wherein said (b) calculating includes:

incrementing said second histogram for said absolute value of said position difference by a product of said first histograms for said two fail bits within said specified region.

12. A failure analysis method according to claim 11, wherein said (d) calculating includes:

calculating the following equation for said expectation function value:

$$T(f)=2f\Sigma H(d_f)/(n^2-\Sigma W^2)$$

where T(f) is said expectation function value for said value f, $d_f$ is said absolute value of said position difference having said value f as a divisor, $H(d_f)$ is said second histogram for said absolute value of said position difference $d_f$, W is each of said first histograms, and n is the number of said fail bits within said specified region.

13. A failure analysis method according to claim 8, further comprising:

specifying said specified region.

14. A failure analysis method according to claim 8, wherein said (e) determining includes:

determining that said fail bits within said specified region has said regularity for said value, when said expectation function value for said value is larger than 1.

15. A failure analysis method of a semiconductor memory device, comprising:

(a) determining whether a position of each of fail bits of a two-dimensional bit map is within a specified region while updating a first histogram for said position, said bit map indicating a map of fail bits, each fail bit corresponding to a fail memory cell, and said fail bit within said specified region being a regional fail bit;

(b) carrying out first calculation of an absolute value of a position difference between two regional fail bits while incrementing a second histogram for said absolute value of said position difference by a first value, repeating said first calculation to all combinations of two of said regional fail bits, and carrying second calculation of a first expectation function value for each of values from said second histograms and the number of said regional fail bits;

(c) carrying out third calculation of said absolute value of said position difference between two of said regional fail bits while incrementing a third histogram for said absolute value of said position difference by a second value which is determined based on said first histograms for said two regional fail bits, repeating said third calculation to all combinations of two of said regional fail bits, and carrying out fourth calculation of a second expectation function value for said value from said first and second histograms and the number of said regional fail bits, said first and second expectation function values indicating regularity of said regional fail bits;

(d) selectively executing one of said (b) and said (c) based on an execution time of said (b) and an execution time of said (c); and (e) determining whether said regional fail bits has regularity or irregularity for each value, based on said calculated expectation function value for said value.

16. A failure analysis method according to claim 15, wherein each of said (b) and (c) includes:

carrying out said first or third calculation of said absolute value of said position difference in X- or Y coordinate.

17. A failure analysis method according to claim 15, wherein said (a) determining includes:

incrementing said first histogram for said regional fail bit by "1".

18. A failure analysis method according to claim 17, wherein said (b) carrying out second calculation includes:

calculating the following equation for said first expectation function value:

$$T(f)=2f\Sigma H(d_f)/\{n(n-1)-2H(0)\}$$

where T(f) is said calculated first expectation function value for said value f, $d_f$ is said absolute value of said position difference having said value f as a divisor, $H(d_f)$ is said second histogram for said absolute value of said position difference $d_f$, H(0) is said second histogram for said absolute value of said position difference of "0", and n is the number of said regional fail bits.

19. A failure analysis method according to claim 17, wherein said (c) carrying out said third calculation includes:

incrementing said third histogram for said absolute value of said position difference by a product of said first histograms for said two regional fail bits.

20. A failure analysis method according to claim 19, wherein said (c) carrying out said fourth calculation includes:

calculating the following equation for said second expectation function value:

$$T(f)=2f\Sigma H(d_f)/(n^2 - \Sigma W^2)$$

where T(f) is said second expectation function value for said value f, $d_f$ is said absolute value of said position difference having said value f as a divisor, $H(d_f)$ is said third histogram for said absolute value of said position difference $d_f$, W is each of said first histograms, and n is the number of said regional fail bits.

21. A failure analysis method according to claim 15, further comprising:
   specifying said specified region.

22. A failure analysis method according to claim 15, wherein said (e) determining includes:
   determining that said fail bits within said specified region has said regularity for said value, when said calculated expectation function value for said value is larger than "1".

23. A failure analysis apparatus of a semiconductor memory device, comprising:
   a first processing unit which calculates an absolute value of a position difference between two fail bits of a two-dimensional bit map while updating a histogram corresponding to said absolute value of said position difference, said bit map indicating a map of fail bits and each fail bit corresponding to a fail memory cell;
   a second processing unit which repeatedly activates said first processing unit for all combinations of two of said fail bits in said bit map;
   a third processing unit which calculates an expectation function value for each of values from said histograms and the number of said fail bits, said expectation function value indicating regularity of said fail bits; and
   a fourth processing unit which determines whether said fail bits has regularity or irregularity for each value, based on said calculated expectation function value for said value.

24. A failure analysis apparatus according to claim 23, wherein said first processing unit calculates said absolute value of said position difference in X- or Y-coordinate.

25. A failure analysis apparatus according to claim 23, wherein said first processing unit increments said histogram corresponding to said difference by "1".

26. A failure analysis apparatus according to claim 25, wherein said third processing unit calculates the following equation for said expectation function value:

$$T(f)=2f\Sigma H(d_f)/\{n(n-1)-2H(0)\}$$

where T(f) is said expectation function value for said value f, $d_f$ is said absolute value of said position difference having said value f as a divisor, $H(d_f)$ is said histogram for said absolute value of said position difference $d_f$, H(0) is said histogram for said absolute value of said position difference of "0", and n is the number of said fail bits.

27. A failure analysis apparatus according to claim 23, wherein said second processing unit determines whether each of said fail bits is within a specified region, and repeatedly activates said first processing unit to all combinations of two of all said fail bits within said specified region in said bit map.

28. A failure analysis apparatus according to claim 23, further comprising:
   an input unit used to specify said specified region.

29. A failure analysis apparatus according to claim 23, wherein said fourth processing unit determines that said fail bits has said regularity for said value, when said expectation function value for said value is larger than "1".

30. A failure analysis apparatus of a semiconductor memory device, comprising:
   a first processing unit which determines whether a position of each of fail bits of a two-dimensional bit map is within a specified region while updating a first histogram for said position, said bit map indicating a map of fail bits and each fail bit corresponding to a fail memory cell;
   a second processing unit which calculates an absolute value of a position difference between two of said fail bits within said specified region while updating a second histogram for said absolute value of said position difference with said first histograms for said two fail bits;
   a third processing unit which repeatedly activates said second processing unit to all combinations of two of said fail bits within said specified region;
   a fourth processing unit which calculates an expectation function value for each of values from said first and second histograms and the number of said fail bits within said specified region, said expectation function value indicating regularity of said fail bits within said specified region; and
   a fifth processing unit which determines whether said fail bits within said specified region has regularity or irregularity for each value, based on said calculated expectation function value for said value.

31. A failure analysis apparatus according to claim 30, wherein said second processing unit calculates said absolute value of said position difference in X- or Y-coordinate.

32. A failure analysis apparatus according to claim 30, wherein said first processing unit increments said first histogram for said fail bit within said specified region by "1".

33. A failure analysis apparatus according to claim 32, wherein said second processing unit increments said second histogram for said absolute value of said position difference by a product of said first histograms for said two fail bits within said specified region.

34. A failure analysis apparatus according to claim 33, wherein said fourth processing unit calculates the following equation for said expectation function value:

$$T(f)=2f\Sigma H(d_f)/(n^2-\Sigma W^2)$$

where T(f) is said expectation function value for said value f, $d_f$ is said absolute value of said position difference having said value f as a divisor, $H(d_f)$ is said second histogram for said absolute value of said position difference $d_f$, W is each of said first histograms, and n is the number of said fail bits within said specified region.

35. A failure analysis apparatus according to claim 30, further comprising:
   an input unit used to specify said specified region.

36. A failure analysis apparatus according to claim 30, wherein said fifth processing unit determines that said fail bits within said specified region has said regularity for said value, when said expectation function value for said value is larger than 1.

37. A failure analysis apparatus of a semiconductor memory device, comprising:
   a first processing unit which determines whether a position of each of fail bits of a two-dimensional bit map is within a specified region while updating a first histogram for said position, said bit map indicating a map of fail bits, each fail bit corresponding to a fail memory cell, and said fail bit within said specified region being a regional fail bit;

a second processing unit which carries out first calculation of an absolute value of a position difference between two regional fail bits while incrementing a second histogram for said absolute value of said position difference by a first value, repeatedly carrying out said first calculation of said absolute value of said position difference to all combinations of two of said regional fail bits, and carries out second calculation of a first expectation function value for each of values from said second histograms and the number of said regional fail bits;

a third processing unit which carries out third calculation of said absolute value of said position difference between two of said regional fail bits while incrementing a third histogram for said absolute value of said position difference by a second value which is determined based on said first histograms for said two regional fail bits, repeats said third calculation to all combinations of two of said regional fail bits, and carries out fourth calculation of a second expectation function value for said value from said first and second histograms and the number of said regional fail bits, said first and second expectation function values indicating regularity of said regional fail bits;

a fourth processing unit which selectively activates one of said second and third processing units based on an execution time of said second processing unit and an execution time of said third processing unit; and a fifth processing unit which determines whether said regional fail bits has regularity or irregularity for each value, based on said calculated expectation function value for said value.

38. A failure analysis apparatus according to claim 37, wherein each of said second and third processing units carries out said first or third calculation of said absolute value of said position difference in X- or Y coordinate.

39. A failure analysis apparatus according to claim 37, wherein said first processing unit increments said first histogram for said regional fail bit by "1".

40. A failure analysis apparatus according to claim 39, wherein said second processing unit calculates the following equation for said first expectation function value:

$$T(f)=2f\Sigma H(d_f)/\{n(n-1)-2H(0)\}$$

where T(f) is said calculated first expectation function value for said value f, $d_f$ is said absolute value of said position difference having said value f as a divisor, $H(d_f)$ is said second histogram for said absolute value of said position difference $d_f$, H(0) is said second histogram for said absolute value of said position difference of "0", and n is the number of said regional fail bits.

41. A failure analysis apparatus according to claim 39, wherein said third processing unit increments said third histogram for said absolute value of said position difference by a product of said first histograms for said two regional fail bits.

42. A failure analysis apparatus according to claim 41, wherein said third processing unit calculates the following equation for said second expectation function value:

$$T(f)=2f\Sigma H(d_f)/(n^2-\Sigma W^2)$$

where T(f) is said second expectation function value for said value f, $d_f$ is said absolute value of said position difference having said value f as a divisor, $H(d_f)$ is said third histogram for said absolute value of said position difference $d_f$, W is each of said first histograms, and n is the number of said regional fail bits.

43. A failure analysis apparatus according to claim 37, further comprising:

an input unit used to specify said specified region.

44. A failure analysis apparatus according to claim 37, wherein said fifth processing unit determines that said fail bits within said specified region has said regularity for said value, when said calculated expectation function value for said value is larger than "1".

45. A recording medium which stores a program for a failure analysis method of a semiconductor memory device, wherein said failure analysis method comprises:

(a) calculating an absolute value of a position difference between two fail bits of a two-dimensional bit map while updating a histogram corresponding to said absolute value of said position difference, said bit map indicating a map of fail bits and each fail bit corresponding to a fail memory cell;

(b) repeating said (a) calculating to all combinations of two of said fail bits in said bit map;

(c) calculating an expectation function value for each of values from said histograms and the number of said fail bits, said expectation function value indicating regularity of said fail bits; and (d) determining whether said fail bits has regularity or irregularity for each value, based on said calculated expectation function value for said value.

46. A recording medium according to claim 45, wherein said (a) calculating includes:

calculating said absolute value of said position difference in X- or Y-coordinate.

47. A recording medium according to claim 45, wherein said (a) calculating includes:

incrementing said histogram corresponding to said difference by "1".

48. A recording medium according to claim 47, wherein said (c) calculating includes:

calculating the following equation for said expectation function value:

$$T(f)=2f\Sigma H(d_f)/\{n(n-1)-2H(0)\}$$

where T(f) is said expectation function value for said value f, $d_f$ is said absolute value of said position difference having said value f as a divisor, $H(d_f)$ is said histogram for said absolute value of said position difference $d_f$, H(0) is said histogram for said absolute value of said position difference of "0", and n is the number of said fail bits.

49. A recording medium according to claim 45, wherein said (b) repeating includes:

determining whether each of said fail bits is within a specified region; and repeating said (a) calculating to all combinations of two of all said fail bits within said specified region in said bit map.

50. A recording medium according to claim 49, further comprising: specifying said specified region.

51. A recording medium according to claim 45, wherein said (d) determining includes:

determining that said fail bits has said regularity for said value, when said expectation function value for said value is larger than "1".

52. A recording medium which stores a program for a failure analysis method of a semiconductor memory device, wherein said failure analysis method comprises:

(a) determining whether a position of each of fail bits of a two-dimensional bit map is within a specified region while updating a first histogram for said position, said bit map indicating a map of fail bits and each fail bit corresponding to a fail memory cell;

(b) calculating an absolute value of a position difference between two of said fail bits within said specified region while updating a second histogram for said absolute value of said position difference with said first histograms for said two fail bits;

(c) repeating said (b) calculating to all combinations of two of said fail bits within said specified region;

(d) calculating an expectation function value for each of values from said first and second histograms and the number of said fail bits within said specified region, said expectation function value indicating regularity of said fail bits within said specified region; and (e) determining whether said fail bits within said specified region has regularity or irregularity for each value, based on said calculated expectation function value for said value.

53. A recording medium according to claim 52, wherein said (b) calculating includes:

calculating said absolute value of said position difference in X- or Y-coordinate.

54. A recording medium according to claim 52, wherein said (a) determining includes:

incrementing said first histogram for said fail bit within said specified region by "1".

55. A recording medium according to claim 54, wherein said (b) calculating includes:

incrementing said second histogram for said absolute value of said position difference by a product of said first histograms for said two fail bits within said specified region.

56. A recording medium according to claim 55, wherein said (d) calculating includes:

calculating the following equation for said expectation function value:

$$T(f)=2f\Sigma H(d_f)/(n^2-\Sigma W^2)$$

where T(f) is said expectation function value for said value f, $d_f$ is said absolute value of said position difference having said value f as a divisor, $H(d_f)$ is said second histogram for said absolute value of said position difference $d_f$, W is each of said first histograms, and n is the number of said fall bits within said specified region.

57. A recording medium according to claim 52, further comprising:

specifying said specified region.

58. A recording medium according to claim 52, wherein said (e) determining includes:

determining that said fail bits within said specified region has said regularity for said value, when said expectation function value for said value is larger than 1.

59. A recording medium which stores a program for a failure analysis method of a semiconductor memory device, wherein said failure analysis method comprises:

(a) determining whether a position of each of fail bits of a two-dimensional bit map is within a specified region while updating a first histogram for said position, said bit map indicating a map of fail bits, each fail bit corresponding to a fail memory cell, and said fail bit within said specified region being a regional fail bit;

(b) carrying out first calculation of an absolute value of a position difference between two regional fail bits while incrementing a second histogram for said absolute value of said position difference by a first value, repeating said first calculation to all combinations of two of said regional fail bits, and carrying second calculation of a first expectation function value for each of values from said second histograms and the number of said regional fail bits;

(c) carrying out third calculation of said absolute value of said position difference between two of said regional fail bits while incrementing a third histogram for said absolute value of said position difference by a second value which is determined based on said first histograms for said two regional fail bits, repeating said third calculation to all combinations of two of said regional fail bits, and carrying out fourth calculation of a second expectation function value for said value from said first and second histograms and the number of said regional fail bits, said first and second expectation function values indicating regularity of said regional fail bits;

(d) selectively executing one of said (b) and said (c) based on an execution time of said (b) and an execution time of said (c); and (e) determining whether said regional fail bits has regularity or irregularity for each value, based on said calculated expectation function value for said value.

60. A recording medium according to claim 59, wherein each of said (b) and (c) includes;

carrying out said first or third calculation of said absolute value of said position difference in X- or Y coordinate.

61. A recording medium according to claim 59, wherein said (a) determining includes:

incrementing said first histogram for said regional fail bit by "1".

62. A recording medium according to claim 61, wherein said (b) carrying out second calculation includes;

calculating the following equation for said first expectation function value:

$$T(f)=2f\, H(d_f)/\{n(n-1)-2H(0)\}$$

where T(f) is said calculated first expectation function value for said value f, $d_f$ is said absolute value of said position difference having said value f as a divisor, $H(d_f)$ is said second histogram for said absolute value of said position difference $d_f$, H(0) is said second histogram for said absolute value of said position difference of "0", and n is the number of said regional fail bits.

63. A recording medium according to claim 61, wherein said (c) carrying out said third calculation includes:

incrementing said third histogram for said absolute value of said position difference by a product of said first histograms for said two regional fail bits.

64. A recording medium according to claim 63, wherein said (c) carrying out said fourth calculation includes:

calculating the following equation for said second expectation function value:

$$T(f)=2f\Sigma H(d_f)/(n^2-\Sigma W^2)$$

where T(f) is said second expectation function value for said value f, $d_f$ is said absolute value of said position difference having said value f as a divisor, $H(d_f)$ is said third histogram for said absolute value of said position difference $d_f$, W is each of said first histograms, and n is the number of said regional fail bits.

65. A recording medium according to claim 59, further comprising:

specifying said specified region.

66. A recording medium according to claim 59, wherein said (e) determining includes:

determining that said fail bits within said specified region has said regularity for said value, when said calculated expectation function value for said value is larger than "1".

* * * * *